United States Patent [19]

Inoue et al.

[11] Patent Number: 4,594,473

[45] Date of Patent: Jun. 10, 1986

[54] SUBSTRATE HAVING AT LEAST ONE FINE-WIRED CONDUCTIVE LAYER

[75] Inventors: Tatsuo Inoue; Mitsuru Kimura, both of Tokyo, Japan

[73] Assignee: NEC Corporation, Tokyo, Japan

[21] Appl. No.: 587,917

[22] Filed: Mar. 9, 1984

[30] Foreign Application Priority Data

Mar. 11, 1983 [JP] Japan .................................. 58-40060

[51] Int. Cl.[4] .............................................. H05K 1/09
[52] U.S. Cl. .................................... 174/68.5; 427/96; 427/125; 428/901
[58] Field of Search ............... 174/68.5; 156/901, 902; 427/96, 125; 428/901

[56] References Cited

U.S. PATENT DOCUMENTS

| | | | |
|---|---|---|---|
| 3,576,722 | 4/1971 | Fennimore et al. | 174/68.5 |
| 3,634,159 | 1/1972 | Croskery | 174/68.5 |
| 4,031,272 | 6/1977 | Khanna | 427/96 |
| 4,068,022 | 1/1978 | Glick | 427/125 |
| 4,226,932 | 10/1980 | Ferraris | 174/68.5 |
| 4,281,057 | 7/1981 | Castellani et al. | 430/270 |

OTHER PUBLICATIONS

Berry et al., "Thin Film Technology", pp. 146-149, 1968 Princeton, N.J.
IBM Technical Disclosure Bulletin, "High Structure . . . Wiring", vol. 24, No. 12, May 1982, Archey et al.
Feinstein et al., "Performance of . . . Environment", IEEE Transactions . . . Technology", vol. CHMT-2, No. 2, Jun. 1979, pp. 159-171.

Primary Examiner—Arthur T. Grimley
Assistant Examiner—Morris H. Nimmo
Attorney, Agent, or Firm—Burns, Doane, Swecker & Mathis

[57] ABSTRACT

A fine-wired conductor for use in LSI circuits exhibits good adhesion properties. The conductor is made up of a film of metal such as chrome or titanium on an insulator such as a ceramic substrate, a gold layer over the film of metal and a palladium film on the gold layer. In addition, a palladium layer can be interposed between the metal film and the gold layer to facilitate gold plating and inhibit diffusion of the metal and the gold.

6 Claims, 3 Drawing Figures

SUBSTRATE HAVING AT LEAST ONE FINE-WIRED CONDUCTIVE LAYER

BACKGROUND OF THE INVENTION

This invention relates to a substrate having at least one fine-wired conductive layer, which is suitable for mounting large-scale integrated (LSI) circuits used in data processing and communication systems.

In a wired substrate mounted with LSI circuits for use in high speed computers implemented with highly dense designing, gold and copper can be used as wiring conductive layers to keep the electric resistances of said conductive layers sufficiently low. Further, polyimide resin having a high insulating capacity and a low dielectric rate can be used as an insulator between the wiring conductive layers of a multi-layered substrate. However, an inadequate adhesion of the polyimide resin insulating layers and the conductive layers consisting of gold or copper, tend to cause their exfoliation from one another with the result that the performance and reliability of the substrate circuit are substantially deteriorated. To obviate these disadvantages, a paper entitled "High Reliability Metallurgical Structure for Multi-level Substrate Wiring" by W. B. Archey et al published in IBM Technical Disclosure Bulletin, Vol. 24, No. 12, May 1982, p. 6370 proposes a wired substrate having a polyimide resin layer in which chrome films are formed over the surfaces of a copper conductive layer as shown in the drawing. However, the chrome films are adversely affected when exposed to an external environment in the process of forming the wiring conductor and the polyimide resin film.

SUMMARY OF THE INVENTION

One object of the present invention is, therefore, to provide a substrate having at least one fine-wired conductive layer that is free from the above-mentioned disadvantages. According to one aspect of the present invention, there is provided a substrate, which comprises: a film consisting of chrome or titanium formed on the surface of an insulated substrate itself or of an insulating layer formed over the substrate; a gold layer formed on said film consisting of chrome or titanium; and a palladium film formed on the gold layer, whereby a fine wiring conductive layer is formed over the substrate.

The foregoing and other features and advantages of this invention will be apparent from the following more particular description of the preferred embodiments of the invention as illustrated in the accompanying drawings.

BRIEF DESCRIPTION OF THE DRAWINGS

In the drawings, the same reference numerals denote the same structural elements.

DETAILED DESCRIPTION OF THE PREFERRED EMBODIMENTS

A very fine and low-resistivity wiring conductive layer consisting essentially of gold or copper, can be generally formed by a selective plating technique.

For a specific example of using that technique, U.S. Pat. No. 4,281,057 can be referred to. In this example, such a conductive layer is formed with a film thickness of five microns, a wiring width of five microns and wiring intervals of three microns each.

It is to be noted that such a selective plating technique was employed to form each wiring conductive layer used in the embodiments of the invention described hereunder.

Figure 1:
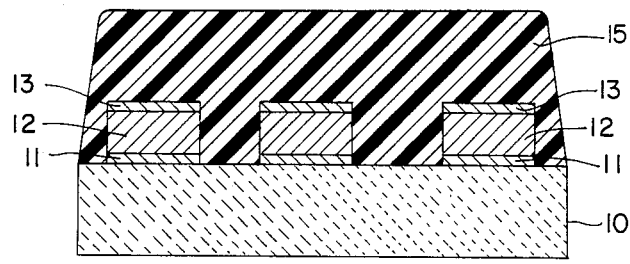
FIG. 1 shows a first embodiment of the invention.

Referring to FIG. 1, a first embodiment comprises wiring conductive layers 11 to 13 formed over a ceramic substrate 10. The layers 11 to 13 consists of a 500-angstrom thick titanium film 11, a 5-micron thick gold-plated layer 12 and a 1-micron thick palladium-plated layer 13. These layers 11, 12 and 13 are formed according to a desired wiring pattern. These layers 11, 12 and 13 are covered by a passivation material 15 of polyimide resin.

Thus, in the first embodiment, the titanium film 11 provides a good adhesion to the ceramic substrate 10.

Figure 2:
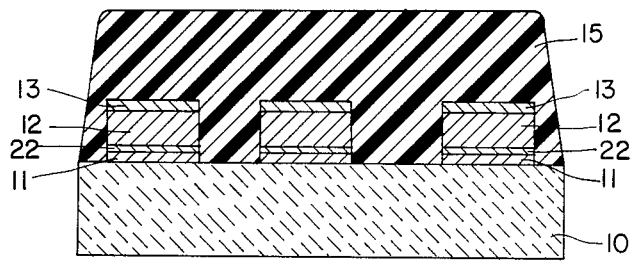
FIG. 2 shows a second embodiment of the invention.

Referring to FIG. 2, a second embodiment comprises wiring conductive layers 11 to 13 and 22 formed on the ceramic substrate 10. Each of the wiring conductive layers consists of a 500-angstrom thick titanium film 11, a 1,000-angstrom thick palladium film 22, a 5-micron thick gold-plated layer 12 and a 1-micron thick palladium-plated layer 13. These layers 11 to 13 and 22 are covered by the passivation material 15 of polyimide resin.

The strength of the adhesion of the polyimide resin layer 15 to the palladium-plated layer 13 is no less than 2 kg/mm$^2$ in terms of the limit at which exfoliation occurs in a tension test in which a tensile force is applied in a direction normal to the layer surface. This means that a much greater strength of the adhesion can be achieved, compared with the corresponding limit of no more than 0.5 kgm/mm$^2$ observed in a similar test of a polyimide resin film adhering to a gold layer.

In the second embodiment, the titanium film 11 is used for achieving a sufficient strength of adhesion to the substrate. Further, the palladium film 22 serves to facilitate the gold plating over the titanium film as well as to prevent the mutual diffusion of titanium and gold.

Figure 3:
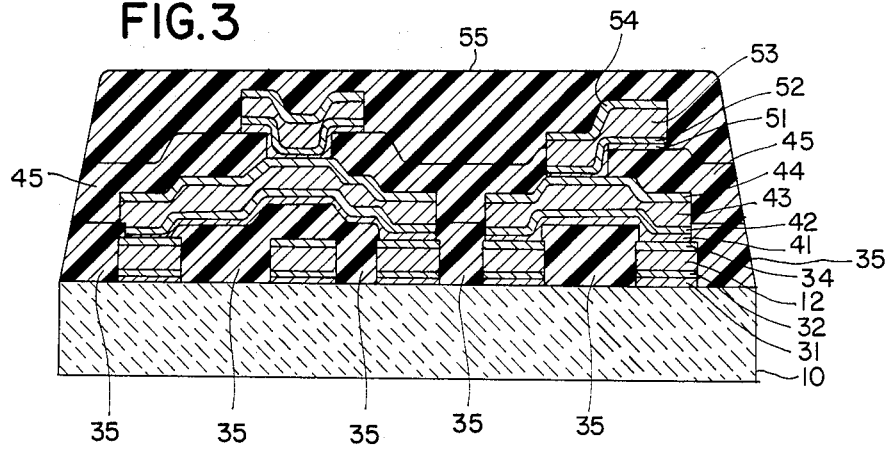
FIG. 3 shows a third embodiment of the invention.

Turning to FIG. 3, a third embodiment comprises multiple wiring conductive layers and polyimide resin employed for insulation between the layers. More specifically, there is a first wiring layer consisting of a chrome film 31, a palladium film 32, a gold-plated layer 12, and palladium-plated layer 34 formed over the ceramic substrate 10. This first wiring layer is covered by a first insulating layer 35 of polyimide resin. Over the layer 35, a second wiring layer is provided to comprise a chrome film 41, a palladium film 42, a gold-plated layer 43, and a palladium-plated layer 44. The second and first wiring layers can be electrically connected through a hole bored in a part of said first insulating layer 35.

A second insulating layer 45 of polyimide resin is formed to cover the second wiring layer. A third wiring layer similar in structure to the other wiring layers is provided over the layer 45. The third wiring layer consists of a chrome film 51, a palladium film 52, a gold-plated layer 53 and a palladium-plated layer 54.

In the third embodiment, the chrome film 31 provides a good adhesion to the ceramic substrate 10. For the same reason as in the second embodiment, palladium films 32, 42 and 52 are formed between the chrome films 31, 41 and 51, and the gold-plated layers 12, 43 and 53 respectively. This configuration achieved by the palladium plated layers 34, 44, and 54 attains a sufficient adhesion to the polyimide resin layers 35, 45 and 55. In addition, the palladium films 32, 42 and 52 protects the wiring conductive layers 12, 43 and 53 from being exposed to the adverse environment during the manufacturing process of the conductive layer and the polyimide resin layers 35, 45 and 55.

In the third embodiment, the polyimide resin layer 35 is formed over the first wiring conductive layers, and further the second wiring conductive layers are formed over the resin layer 35. The bottom layer of the second wiring conductor, which consists of the chrome film 41, adheres well to the resin layer 35.

The present invention can provide a sufficient adhesion between the wiring conductive layers and the polyimide resin layer by forming the palladium layer over the surface of gold wiring.

Many other modifications and alternatives to the embodiments can be easily made with the scope of the invention defined by the appended claims.

What is claimed is:

1. A substrate comprising a first fine wiring conductive layer consisting of a first metal film formed over the surface of an insulated substrate, a gold conductive layer formed over said first metal film, a first palladium film formed over said gold conductive layer; and a polyimide resin layer covering said first fine wiring conductive layer.

2. A substrate, as claimed in claim 1, wherein said first metal film is selected from the group consisting of chrome and titanium.

3. A substrate, as claimed in claim 2, wherein said first conductive layer further comprises a second palladium film provided between said first metal film and said gold conductive layer.

4. A substrate, as claimed in claim 1, 2 or 3, and further including a second fine wiring layer disposed over said polyimide resin layer to thereby form a multi-layered wiring conductor.

5. A substrate, as claimed in claim 4, wherein said second conductive layer includes a second metal film, a gold conductive layer and a palladium film in that order.

6. A substrate, as claimed in claim 5, wherein said second metal film is selected from the group consisting of chrome and titanium.

* * * * *